United States Patent
Chen et al.

(10) Patent No.: US 9,331,221 B2
(45) Date of Patent: May 3, 2016

(54) LIFT-OFF LAYER FOR SEPARATION AND DISPOSAL OF ENERGY CONVERSION DEVICES

(75) Inventors: Sung-Wei Chen, Las Vegas, NV (US); Christopher J. Rothfuss, Laramie, WY (US)

(73) Assignee: Empire Technology Development LLC, Wilmington, DE (US)

( * ) Notice: Subject to any disclaimer, the term of this patent is extended or adjusted under 35 U.S.C. 154(b) by 756 days.

(21) Appl. No.: 13/579,929

(22) PCT Filed: Apr. 23, 2012

(86) PCT No.: PCT/US2012/034659
§ 371 (c)(1),
(2), (4) Date: Aug. 18, 2012

(87) PCT Pub. No.: WO2013/162498
PCT Pub. Date: Oct. 31, 2013

(65) Prior Publication Data
US 2013/0276885 A1    Oct. 24, 2013

(51) Int. Cl.
*H01L 31/02* (2006.01)
*H01L 31/032* (2006.01)
*H01L 31/0392* (2006.01)

(52) U.S. Cl.
CPC ...... *H01L 31/0322* (2013.01); *H01L 31/03923* (2013.01); *H01L 31/03928* (2013.01); *Y02E 10/541* (2013.01)

(58) Field of Classification Search
USPC ........................................... 438/57, 82
See application file for complete search history.

(56) References Cited

U.S. PATENT DOCUMENTS

| | | | |
|---|---|---|---|
| 4,471,376 A | 9/1984 | Morcom et al. | |
| 6,129,779 A | 10/2000 | Bohland et al. | |
| 6,391,165 B1 | 5/2002 | Bohland et al. | |
| 6,967,115 B1 | 11/2005 | Sheats | |
| 2005/0074915 A1* | 4/2005 | Tuttle et al. | 438/57 |
| 2009/0068780 A1 | 3/2009 | Chen et al. | |
| 2011/0017268 A1* | 1/2011 | Shembel et al. | 136/246 |
| 2012/0219831 A1* | 8/2012 | Mak et al. | 429/9 |
| 2014/0007940 A1* | 1/2014 | Wu et al. | 136/257 |
| 2014/0283907 A1* | 9/2014 | Mushrush et al. | 136/256 |
| 2015/0004737 A1* | 1/2015 | Harley | 438/64 |

FOREIGN PATENT DOCUMENTS

WO    WO 2012043929 A1    4/2012

OTHER PUBLICATIONS

International Search Report and Written Opinion for PCT/US2012/034659 dated May 30, 2012.

(Continued)

*Primary Examiner* — Michael Lebentritt
(74) *Attorney, Agent, or Firm* — Pepper Hamilton LLP

(57) ABSTRACT

Separation layers, usable in devices for converting radiation energy to electrical energy, allow at least some of the components of the devices to be separated from one another for disposal thereof. A separation layer may be interposed between and bonded to adjoining layers, and when acted upon by application of an external source, may be degraded to release the layers from one another. Once released, the layers may be disposed of more efficiently and economically, including proper disposal of hazardous waste, and recycling of materials which may be re-usable.

10 Claims, 6 Drawing Sheets

(56) References Cited

OTHER PUBLICATIONS

Kushiya et al., Development of Recycling and Reuse Technologies for Large-Area Cu(InGa)Se2-Based Thin-Film Modules, Proceedings from the 3rd World Conference on Photovoltaic Energy Conversion (May 11-18, 2003), pp. 1892-1895 (Abstract).

Minemoto et al., Layer Transfer of $Cu(In,Ga)Se_2$ Thin Film and Solar Cell Fabrication, *Japanese Journal of Applied Physics*, (2010), 49(1):012301-012301-4.

Sigmon, flat Panel Displays Slim Down with Plastic, https://www.llnl.gov/str/Sigmon.html [Printed From Internet Jun. 30, 2012].

SPIE Solar Energy + Technology, (Aug. 12-16, 2012), San Diego Convention Center, San Diego, California.

Wendt, CIGS Deposition: A Crucial Challenge, *Solar Industry* (Reprinted from Oct. 2009 issue).

\* cited by examiner

LIFT-OFF LAYER FOR SEPARATION AND DISPOSAL OF ENERGY CONVERSION DEVICES

CROSS-REFERENCE TO RELATED APPLICATIONS

This application is a U.S. national stage filing under 35 U.S.C. §371 of International Application No. PCT/US2012/034659, filed on Apr. 23, 2012 entitled "Lift-Off Layer for Separation and Disposal of Energy Conversion," the disclosure of which is incorporated by reference in its entirety.

BACKGROUND

With ever-increasing energy demands, there is an ongoing desire to harness the radiation which is incident upon the earth. Devices for harnessing this radiation are becoming more prevalent, and since the radiation itself has a broad range of wavelengths extending between about $10^{-2}$ m to about $10^{-12}$ m, a variety of different types of conversion devices are being developed. Such devices typically have one or more layers which collect the radiation and convert it to an electrical output, and are manufactured by depositing these layers of conversion materials on a support substrate. These conversion materials, as well as many other materials incorporated into the layers, however, commonly include toxic substances which require proper and costly disposal.

The majority of the materials used in the construction of the conversion devices, such as the substrates, which can include glass, metals, and plastics, are not toxic. However, due to the layering of materials, and adherence of the non-toxic components with the toxic components, disposal regulations require that the entire structure be handled and disposed of as hazardous material if the toxic components are not removed therefrom. In addition, many of the components incorporated therein, could also be recyclable if separated from the toxic components.

For economic and environmental reasons, it is therefore desirable to provide some separation of the toxic components from the non-toxic components. The mass of toxic material requiring disposal would then be reduced, minimizing the cost of disposal, and also allowing for recyclable materials to be isolated and processed for re-use.

SUMMARY

This disclosure is not limited to the particular systems, devices and methods described, as these may vary. The terminology used in the description is for the purpose of describing the particular versions or embodiments only, and is not intended to limit the scope.

As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this disclosure is to be construed as an admission that the embodiments described in this disclosure are not entitled to antedate such disclosure by virtue of prior invention. As used in this document, the term "comprising" means "including, but not limited to."

In an embodiment, a device for converting incident radiation into electrical energy may include a substrate, a conversion layer configured for converting radiation into electrical energy, and an intermediate layer disposed between the substrate and the conversion layer and removably adhered to at least one of the substrate and the conversion layer for release of the substrate from the conversion layer.

In another embodiment, a CIGS photovoltaic device may include a substrate, a CIGS layer configured for conversion of solar radiation to electrical energy, the CIGS layer having electrical, chemical and physical properties for the conversion of solar radiation to electrical energy, and an intermediate layer disposed between and bonded to the substrate and the CIGS layer, wherein the intermediate layer substantially maintains the electrical, chemical and physical properties when bonded between the CIGS layer and the substrate, and wherein the intermediate layer is degradable by an external influence which substantially maintains the physical properties of the CIGS layer during degradation of the intermediate layer.

In a further embodiment, a method for producing a device for converting radiation into electrical energy may include providing a substrate, providing a conversion layer for converting radiation to electrical energy, and removably adhering an intermediate layer between the substrate and the conversion layer to releasably retain the substrate with the conversion layer and permit release of the conversion layer from the substrate.

In a further embodiment, a method for producing a CIGS photovoltaic device may include providing a substrate, applying an intermediate layer onto the substrate, the intermediate layer comprising a material degradable by an external influence, and applying a CIGS layer to the intermediate layer.

In a further embodiment, a method of using a lift-off layer to separate layers of a device for converting radiation into electrical energy, the device having a substrate, a lift-off layer disposed on the substrate, and a conversion layer disposed on the lift-off layer for conversion of radiation into electrical energy, may include degrading the lift-off layer to release the conversion layer from the substrate, and separating the conversion layer from the substrate.

In a further embodiment, a method for disposing of at least a portion of a device for converting radiation into electrical energy, the device having a substrate and a conversion layer configured to convert radiation into electrical energy, may include separating the conversion layer from the substrate, and separately disposing of at least a portion of each of the substrate and the conversion layer.

In a further embodiment, a method for disposing of a CIGS thin film photovoltaic device, the device having a substrate, a removable layer disposed on the substrate, and a CIGS layer disposed on the removable layer for conversion of solar radiation to electrical energy, wherein the CIGS layer has electrical, chemical and physical properties, and wherein the removable layer substantially maintains the electrical, chemical and physical properties when bonded between the CIGS layer and the substrate, may include degrading the removable layer to release the CIGS layer from the substrate, separating the CIGS layer from the substrate, and separately disposing of the CIGS layer and the substrate.

DETAILED DESCRIPTION

At any given point in time, it is estimated that the earth is receiving 174 petawatts of incoming radiation at the upper atmosphere. Approximately 30% of that incoming radiation is reflected back to space, and the remainder of the incoming radiation is absorbed by clouds, oceans and land masses. The total energy absorbed by the atmosphere, oceans and land masses is approximately 3,850,000 exajoules per year. Based on 2002 statistics, this was more energy in one hour than the world used in one year. The amount of energy reaching the surface of the earth is so vast that in one year it is about twice as much as will ever be obtained from all of the Earth's non-renewable resources of coal, oil, natural gas, and mined uranium combined.

Several technologies exist for harnessing this radiation which is incident upon the earth. Rectennas, or rectifying antennas, directly convert microwave energy into DC electricity. Nantennas, or nanoantennas, are nanoscopic rectifying antennas that convert solar radiation to electricity. Current nantenna technology works most effectively for far infra-red energy. Radiation harvesters convert the energy of various radiations into electricity. Photovoltaic cells convert energy from electromagnetic radiation of shorter wavelengths, such as visible or ultraviolet light, into electric current using the photovoltaic effect. Solar power concentrators use lenses or mirrors and tracking systems to focus a large area of solar radiation, such as sunlight, into a small beam, and use the focused beam as a heat source for a conventional power plant.

Figure 1:
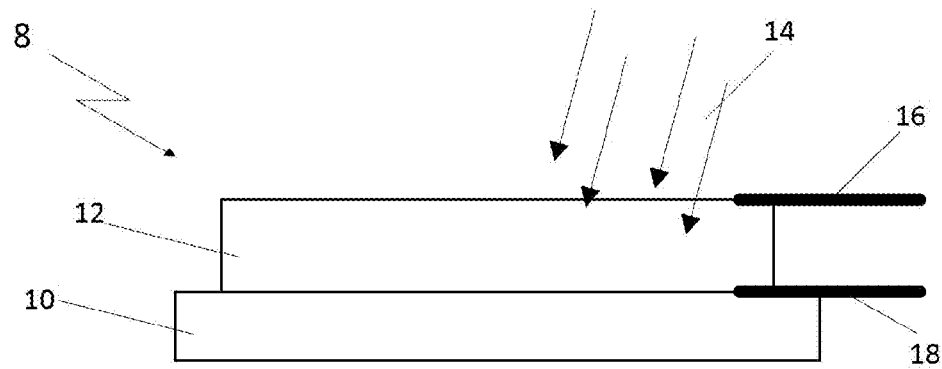
FIG. 1 depicts an illustrative device for converting radiation into electrical energy according to an embodiment.

A device 8 for providing radiation energy conversion can have a somewhat general structure as shown in FIG. 1. Because the size of the conversion components can be on the order of microns to nanometers, a substrate layer 10 may typically be used to support a conversion layer 12. The substrate layer 10 could essentially be any type of solid material capable of providing a support structure, while also possibly providing some flexibility. Such materials could therefore include, but are not limited to, glass, plastics, metals, crystalline materials and semi-conductor materials, and the conversion devices could be formed as flat plates or sheets, or alternatively as flexible rolled materials which are capable of being formed into various shapes to accommodate curved surfaces, etc. The conversion layer 12 could be one or more layers of materials which are capable of receiving incident radiation 14, converting the radiation into an electron flow, and outputting the flow of electrons in a usable manner, for example, via conduction electrodes 16, 18, shown schematically for illustrative purposes only.

Figure 2:
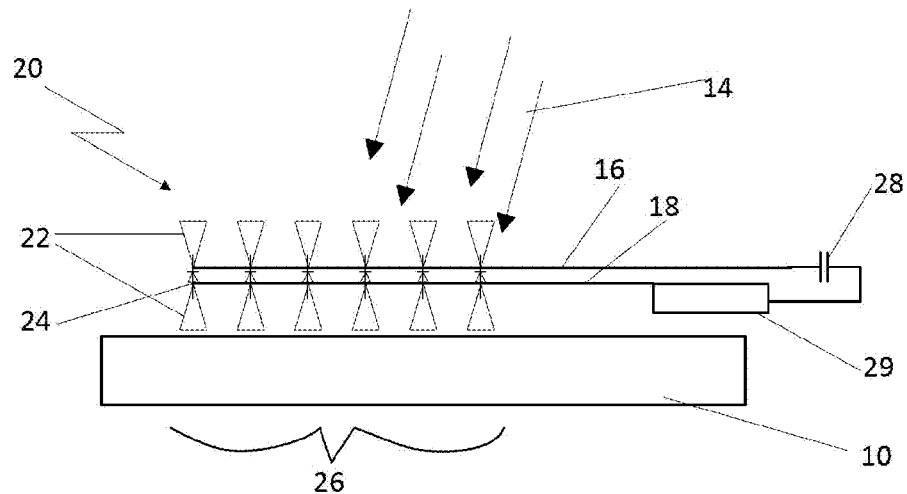
FIG. 2 depicts an illustrative rectenna device according to an embodiment.

With rectennas, 20 such as depicted in FIG. 2, the general concept is to provide a conversion layer that combines micron-sized antennas 22 with rectifiers 24 to form an array 26 having a plurality of such micron-sized rectennas. An example rectenna for energy harvesting may include a dipole-type antenna 22 with the two sides of the dipole connected by the rectifier 24, which may be a diode. The antenna 20 would then receive the infrared electromagnetic radiation 14, and the rectifier 24 would convert the energy to direct current which could be carried via electrodes 16 and 18. The micron-sized antennas 22 could be electromagnetic style antennas designed to pick up infrared radiation frequencies, and could be sufficiently broadband to be responsive to a large range of frequencies in the infrared range for maximum energy scavenging. The rectifier 24 could be a special diode for passing current generated in the antenna in only one direction, preferably with a fast response, a relatively low turn-on voltage, and requiring only a small capacitance so as to minimize its time constant. The micron-sized antenna 22 and rectifier 24 layers could be mounted on a substrate 10 to form the array 26 of interconnected rectennas able to transfer collected DC electrical energy to storage capacitors 28 and batteries 29.

Figure 3:
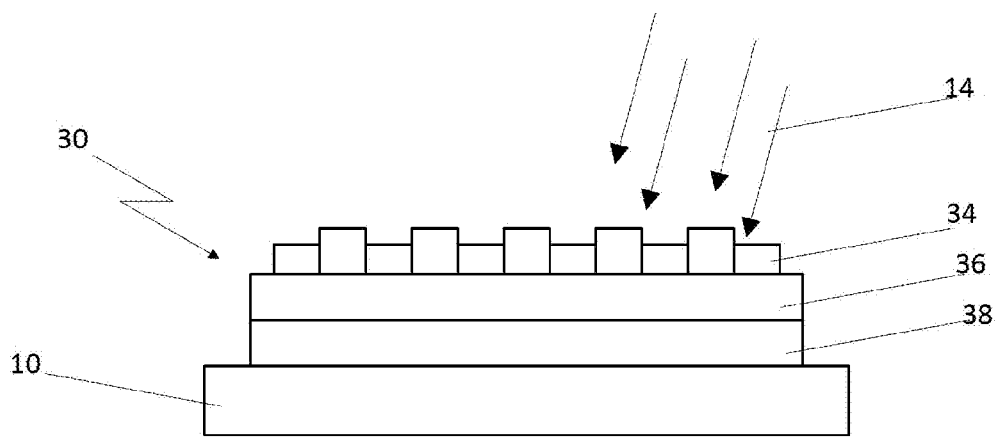
FIG. 3 depicts an illustrative nantenna device according to an embodiment.

Nantennas are similar to rectennas, but are smaller, nano-sized antennas as compared to micron-sized antennas. Thus, in a similar manner, and as depicted in FIG. 3, incident radiation 14 on a nantenna 30 would cause electrons in the nantenna to move back and forth at the same frequency as the incoming radiation. This is caused by the oscillating electric field of the incoming electromagnetic wave. The movement of electrons would be an alternating current in the nantenna circuit, and to convert this into direct current, the alternating current would need to be rectified, by means of a rectifier, or diodes, as discussed with reference to FIG. 2. The resulting DC current could then be used to power an external load. Designs of nantennas may incorporate an antenna layer 34, a dielectric standoff layer 36, and a reflective ground plane 38 on a support substrate 10, wherein the standoff layer 36 serves as an optical resonance cavity. The dielectric to ground plane separation acts as a transmission line that enhances resonance. The thickness of the standoff layer 36 may be selected to be one-fourth of the wavelength of the radiation 14 to be used, to thereby provide proper phasing of the electromagnetic energy.

Figure 4:
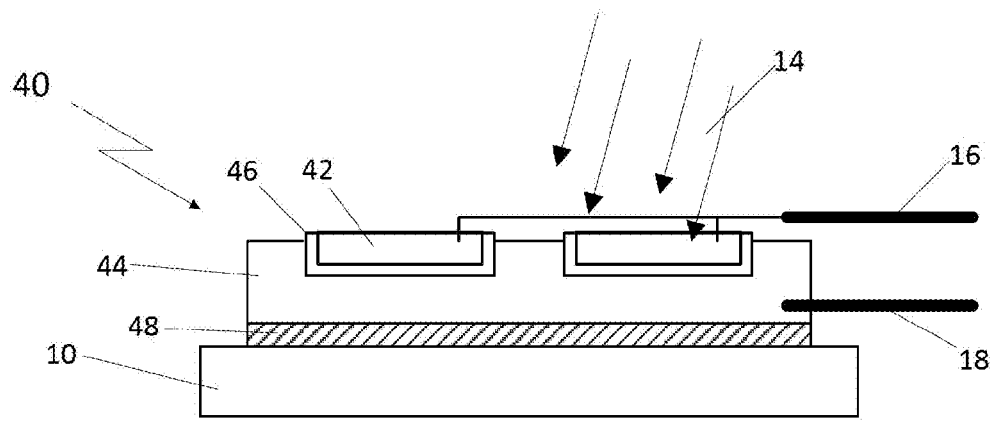
FIG. 4 depicts an illustrative radiation harvester device according to an embodiment.

Radiation harvesters 40, such as in FIG. 4, may include layered materials reactive to incoming radiation particles. One such type of material may have tiles 42 of a carbon conductor packed with gold, surrounded by a conductor 44, which could be lithium hydride. A layer of insulating material 46 may be used for separation of the conducting materials. Radiation 14 incident on the gold can then push out a shower of high-energy electrons. The electrons can pass through the carbon nanotubes and into the lithium hydride, from where they could then move into electrodes 16, 18 providing a current flow.

Photovoltaics remain the more common conversion devices, and include solar panels, such as those which might be mounted on a building to convert sunlight, or solar radiation into electricity. Photovoltaic devices generate electrical power by converting solar radiation into direct current electricity using semiconductors that exhibit the photovoltaic effect. Photovoltaic power generation employs solar panels composed of a number of solar cells containing a photovoltaic material. Some materials presently usable for photovoltaics include monocrystalline silicon, polycrystalline silicon, amorphous silicon, cadmium telluride, copper indium gallium, and copper indium gallium (di)selenide.

Figure 5:
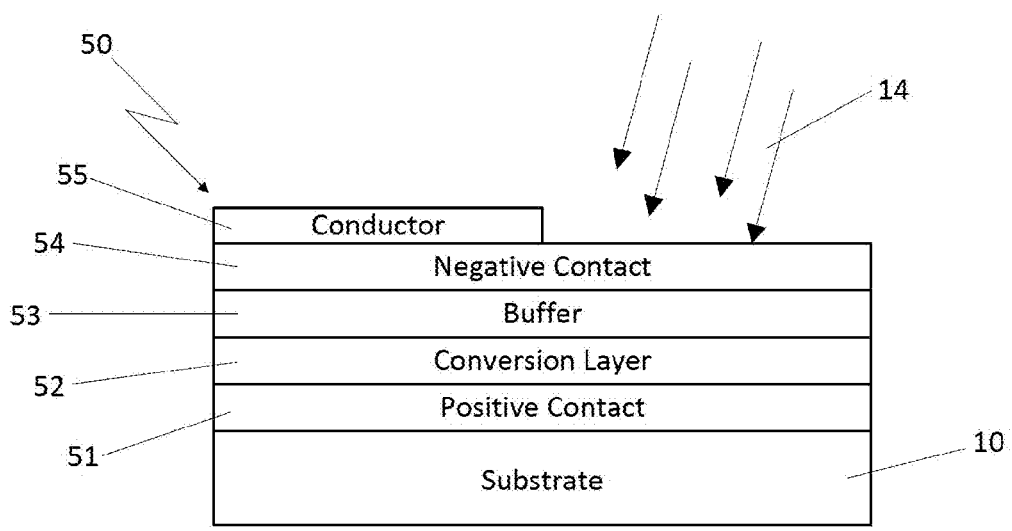
FIG. 5 depicts an illustrative photovoltaic cell according to an embodiment.

FIG. 5 shows a schematic representation of one possible configuration of a thin-film photovoltaic cell 50. A base substrate 10 could have deposited thereon a positive contact layer 51, a conversion layer 52 for converting incident radiation 14 into an electron flow, a buffer layer 53, a negative contact layer 54, and a conductive contact 55. Such thin-film cells offer flexibility, lightweight construction, and a significant decrease in material use allowing greater light collection yields, lower construction costs, and lower materials cost.

Figure 6A:
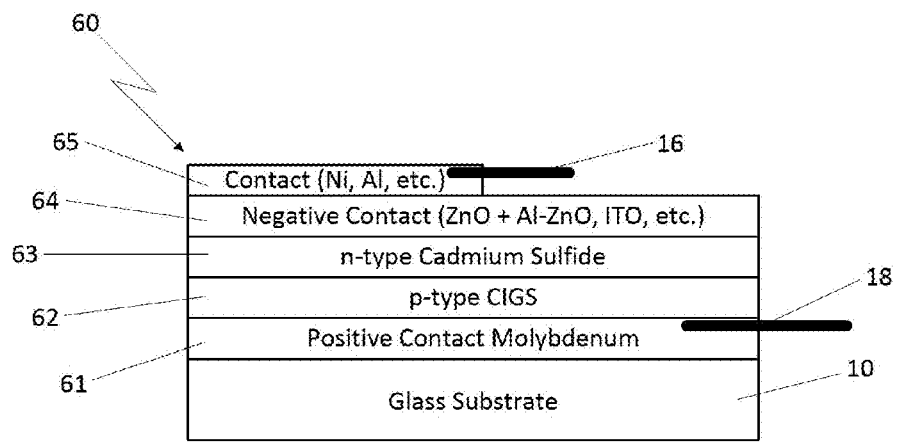
FIG. 6A depicts an illustrative CIGS photovoltaic cell according to an embodiment.

Two types of photovoltaic cells 50 which have shown increased potential for converting radiation into electric energy are the copper indium gallium cell, or CIG cell, and a variant thereof, the copper indium gallium selenium cell (alternatively, copper indium gallium (di)selenide), or CIGS cell 60, shown schematically in FIG. 6A. CIGS cell efficiency approaches that of multicrystalline silicon (20% vs. 20.4%, respectively). Moreover, compared to standard silicon cells, CIGS cells possess higher optical absorption and permit the optical, electrical, and other properties thereof to be tuned for specific applications. CIGS cells also offer higher production yields than cadmium telluride cells.

CIGS solar cells 60 are made up of a number of micrometer thin layers, of which CIGS is the conversion layer 62. In the CIGS layer 62, solar radiation 14 is absorbed by electrons allowing them to free themselves from the positively charged atoms to which they are normally bound. To harness electricity, the freed electrons need to move from the CIGS layer onto a conducting terminal connected to an external electrical circuit. The CIGS layer can preferably be a p-type, or positive-type, CIGS material, which has an increased number of free charge carriers, or holes, therein, typically formed by a doping agent which takes away, or accepts, weakly bound outer electrons of semi-conductor atoms, leaving behind a vacant electron hole.

In the CIGS cell 60, a molybdenum layer 61 provides a positive terminal 18. Molybdenum is a very good conductor of electricity and can serve several other purposes as well. First, molybdenum can provide a low resistance contact to the CIGS layer, a sodium reservoir for sodium, and a reservoir/ion channel for sodium from the substrate for CIGS doping during synthesis. Sodium doping is important for CIGS operation as changes in the sodium function of the molybdenum layer may have significant effects on the absorber lifetime and carrier concentrations. Maintaining the electrical and physical stability of the molybdenum layer plays an important part in the operation of the CIGS cell.

The substrate layer 10, as discussed previously, could essentially be any material which provides a support surface for the remaining layers. It is however desirable that the substrate also provide a sodium reservoir. In this regard, glass provides an effective substrate, however, other materials, such as plastics, metals, crystalline materials and semi-conductor materials, could be used as well. In an embodiment, such materials may include sodium ions or may be doped with sodium. If a sodium free substrate were to be used, an alternative sodium source could be provided. One possibility for this would be a molybdenum-sodium compound deposited as the positive contact layer 61.

The negative contact of a CIGS cell 60 can be provided by a zinc oxide layer 64. The zinc oxide layer 64 may be transparent to sunlight to allow an underlying CIGS layer 62 to receive sunlight. In addition, the zinc oxide layer 64 and the CIGS layer 62 may be used to impart the voltage difference that causes the charges to travel to the terminals 16, 18. The zinc oxide layer 64 may also provide the negative terminal where the electrons accumulate. Although not as conductive as a metal, zinc oxide can be mixed with a couple of percent aluminum to make it both transparent and conductive. An additional conducting portion 65, which can be a metal, such as nickel or aluminum, can be attached to the zinc-oxide layer to provide the terminal 16 for the rest of the electrical circuit.

The layer 63 may be a buffer layer, which may be cadmium sulfide, to essentially provide compatibility and transition issues between the zinc oxide and CIGS. Another possible type of buffer layer could include a zinc oxide/zinc sulfide mixture. The buffer layer 63 may be a n-type layer, in contrast to the p-type CIGS layer. As such, the buffer layer may include a dopant material capable of providing extra conduction electrons to the host material, thus creating an excess of negative electron charge carriers.

Figure 6B:
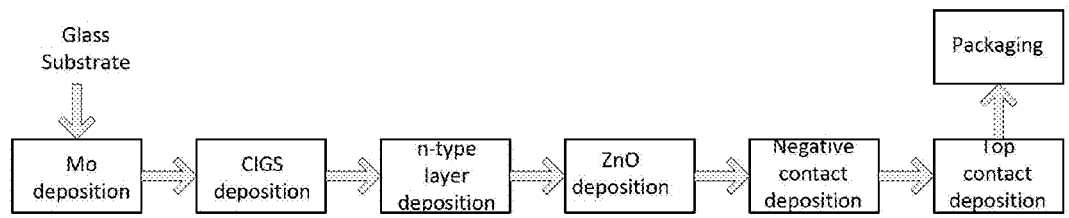
FIG. 6B depicts an illustrative flow diagram for a method of preparing a CIGS device according to an embodiment.

One possible method for producing the CIGS cells 60 of FIG. 6A is schematically illustrated in FIG. 6B. Clean material, such as glass, may be provided for the substrate 10. The molybdenum layer 61 of FIG. 6A may be deposited onto the substrate 10 by a thin-film deposition method. Exemplary thin-film deposition methods include, but are not limited to, sputtering, chemical vapor deposition, solution phase deposition, physical vapor deposition, thermal oxidation, vapor phase epitaxy, electro-deposition, evaporation and casting.

A CIGS layer 62 may also be deposited using one of the thin-film deposition methods described above.

A buffer layer 63 of cadmium sulfide may be applied by a simple wet dip process followed by drying. Alternatively, the buffer layer 63 may be applied by any of the thin film methods described above.

A negative contact layer 64 may comprise one or more zinc oxide layers. In an embodiment having two layers, a relatively thin layer of pure zinc oxide may be applied to the buffer layer 63, and a thicker second layer of zinc oxide containing aluminum may be applied on the first layer. The thicker layer may minimize resistive losses while passing electric current in the cell. In an alternate embodiment, a single relatively thick layer of zinc oxide mixed with aluminum may be provided. The zinc oxide layer, or layers, may also be deposited using any of the thin-film deposition methods described above.

A metal grid, top contact 65, may be provided on the zinc oxide layer 64 to facilitate movement of the electrons. This grid may be deposited by evaporating aluminum through a grid template to form a contact pad wherein the grid lines collect the generated current. The completed thin-layer CIGS device may then be packaged for final use or sale.

Many of the energy conversion devices discussed, being developed, or being considered for future trials, have toxic materials incorporated into their construction for functioning, or improved functioning thereof. Some of these materials include cadmium, selenium, indium, gallium, sulfur and possible dopants in the zinc oxide layers. In even small concentrations, most of these are deemed highly hazardous or toxic, and therefore special consideration must be given to disposal of such devices. Disposal costs for hazardous/toxic materials can be over ten times as costly as disposal of non-hazardous materials.

For CIGS devices, the largest component, by mass, would typically be the substrate material, which may be glass or another non-toxic substance as previously described. In addition, the component having the greatest value per mass in a CIGS device may be molybdenum disposed between the CIGS layer and the substrate. As such, disposal of an entire CIGS device as a unit may be more costly than necessary.

Separation of at least some of the components of the energy conversion devices would be desirable for reducing the costs of disposal by reducing the mass requiring disposal. Moreover, separation of at least some components may also allow for recycling of re-usable components, especially the highest value components.

When applied to CIGS device 60 of FIG. 6A, effective processing may separate the CIGS stack from the glass substrate, allowing for disposal/recycling of the glass as non-toxic. Further processing could then be conducted to recover at least the molybdenum for re-use. Additional processing might be conducted to separate out additional components for re-use, for example, the indium, cadmium, etc. Alternatively, the remaining CIGS layers and components may be disposed of as hazardous/toxic material at a reduced cost.

Figure 7A:
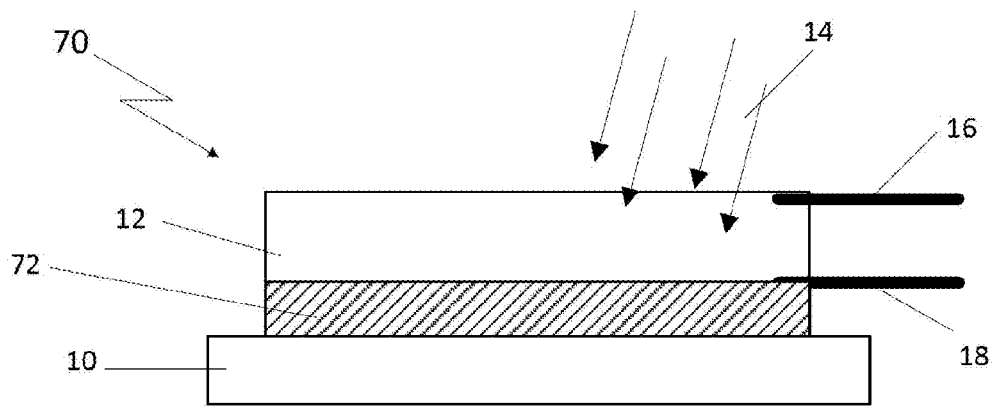
FIG. 7A depicts an illustrative separation layer in a conversion device according to an embodiment.
Figure 7B:
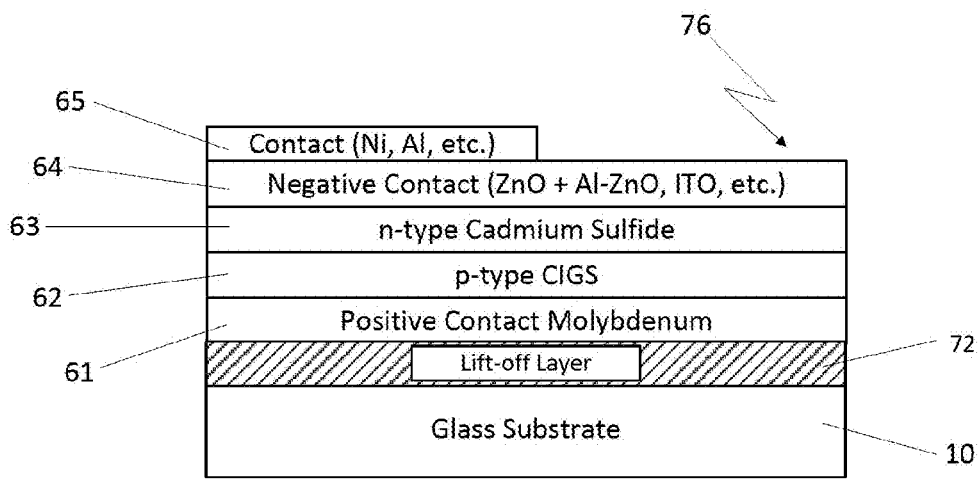
FIG. 7B depicts an illustrative separation layer in a CIGS device according to an embodiment.
Figure 7C:
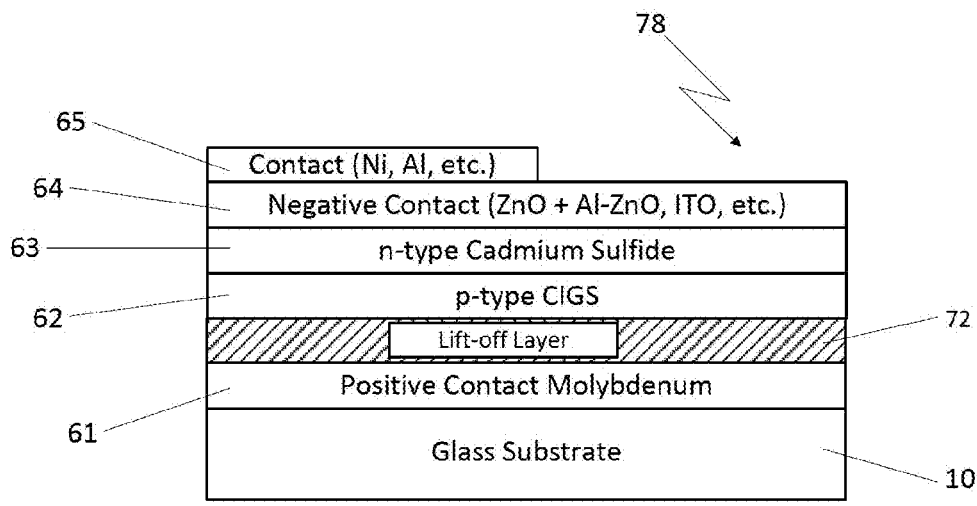
FIG. 7C depicts an alternate illustrative separation layer in a CIGS device according to an embodiment.

To provide a means for facilitating separation of the components of a radiation to electricity conversion device, at least one additional layer 72, shown in conjunction with a general conversion device 70 in FIG. 7A and in conjunction with a CIGS device 76 in FIG. 7B, may be deposited during construction of the devices. This layer 72 may provide a separation, or 'lift-off' layer to allow for separation of components, and/or further processing thereof. As shown in FIG. 7A, the separation layer 72 could be provided between the substrate 10 and conversion layer 12. Similarly, for a CIGS device 76 in FIG. 7B, the separation layer 72 may be provided between the substrate 10 and the molybdenum layer 61. Additionally, the layer 72 may be disposed at other locations in the stack of layers, for example, as shown in the CIGS device 78 in FIG. 7C, between the molybdenum layer 61 and the CIGS layer 62. In an alternative embodiment, more than one layer 72 may be provided for separation of the stack at more than one location.

The separation layer 72 may comprise a material which can be degraded in a manner which at least causes the separation layer to separate from at least one of the adjoining layers between which it is disposed, thereby resulting in at least two separate components for disposal or recycling. It is desirable that the degradation of the layer 72 is caused to occur as the result of an external source which does not naturally occur in the environment in which the conversion device will be used, to thereby prevent premature separation during use. Some such external sources may include, but are not limited to, chemical application or immersion, physical forces, alternative radiation sources different from the sources to which the device will be used, and even biological sources which might break down a separation layer material.

Figure 8:
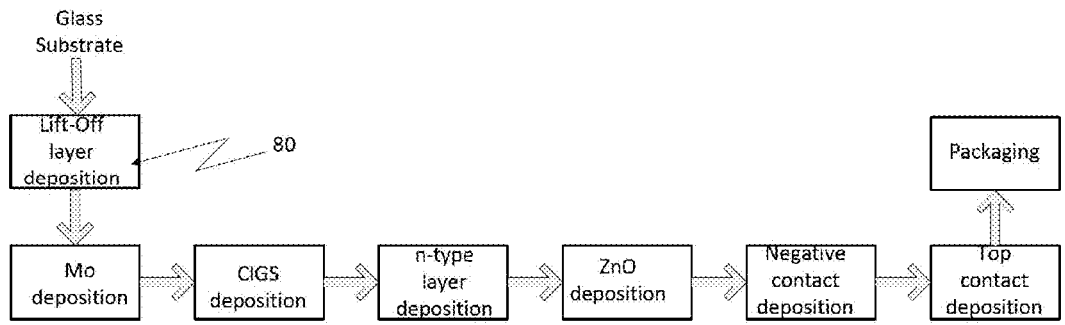
FIG. 8 depicts an illustrative flow diagram for a method of preparing a CIGS device according to an embodiment.

The material of the separation layer may be chosen such that, when incorporated into the conversion device, the material does not substantially interfere with the physical, chemical or electrical properties of the device. In one embodiment, a layer of metal may provide such properties. The deposition of a metal may be done with the same equipment that is used for deposition of the other layers, thereby minimizing additional equipment expenses for construction of the device, and requiring only one additional application step 80, as depicted in FIG. 8. In this regard, the metal layer may also be deposited using any of the thin-film deposition methods discussed above.

For a CIS or CIGS device, metal separation layers do not significantly alter the sodium conduction from the substrate to the molybdenum layer, or the sodium function of the molybdenum. In addition, metal separation layers do not generally affect the physical, chemical and electrical properties of the layers between which they are disposed, such as, the substrate and molybdenum layers. Moreover, a metal separation layer may be degraded by dissolution with an acid or base.

Exemplary metals that could provide suitable separation properties include, but are not limited to: cobalt, lead, platinum, gold, silver, copper, chromium, titanium, zinc, magnesium, scandium, vanadium, manganese, iron, nickel, yttrium, zirconium, niobium, molybdenum, technetium, ruthenium, rhodium, palladium, cadmium, hafnium, tantalum, tungsten, rhenium, osmium, iridium, mercury, rutherfordium, dubnium, seaborgium, bohrium, hassium, meitnerium, ununnilium, unununium, and ununbium.

Exemplary acids that could be used for dissolution of the metals include, but are not limited to: acetic acid, nitric acid, hydrochloric acid, hydrofluoric acid, sulphuric acid, phosphoric acid, and carbonic acid. Exemplary bases that could be used for dissolution of the metals include, but are not limited to: ammonium hydroxide, sodium hydroxide, and potassium hydroxide. Those in the art would readily be knowledgeable of the appropriate acid and/or base needed for dissolution of an indicated metal, however, some illustrative examples may include: lead with acetic acid, nitric acid or a 1:1 acetic acid/water solution, platinum with a hot 3:1 hydrochloric acid/nitric acid solution, gold with a 3:1 hydrochloric acid/nitric acid solution, silver with a 1:1 ammonium hydroxide/hydrogen peroxide solution, copper with a 5:1 nitric acid/water solution, chromium with a 3:1 hydrochloric acid/hydrogen peroxide solution, titanium with a 1:1:20 hydrofluoric acid/water/ethylene glycol solution, zinc with hydrochloric acid, and magnesium with hydrochloric acid.

Figure 9:
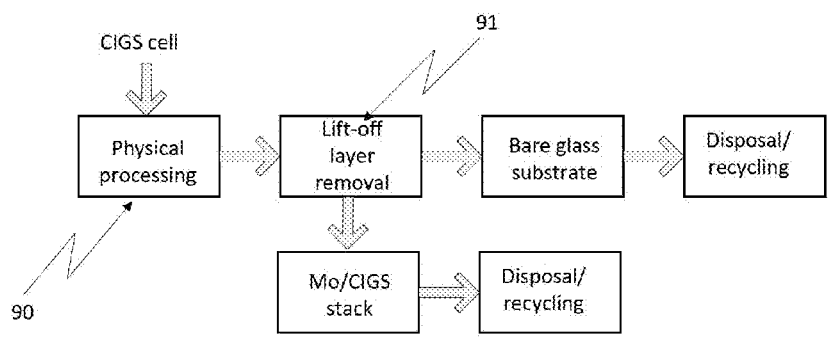
FIG. 9 depicts an illustrative disposal process for a CIGS device using a separation layer according to an embodiment.
Figure 10:
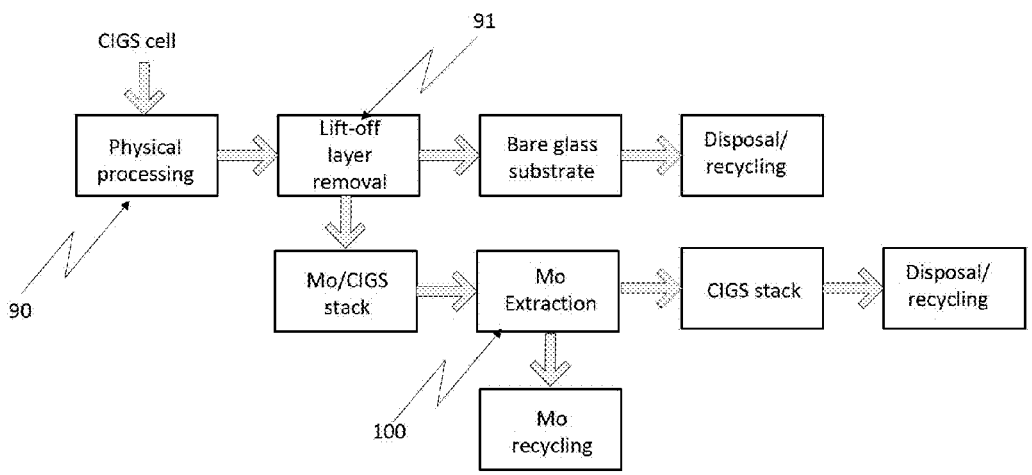
FIG. 10 depicts an alternate illustrative disposal process for a CIGS device using a separation layer according to an embodiment.

As shown in FIGS. 9 and 10, in order to facilitate separation of the layers of a conversion device having a separation layer incorporated therein, at least one physical processing step 90 may be conducted prior to the application of the degrading source. In one embodiment, the physical processing may be a gross separation of large components to remove any packaging, sorting of modules, and/or removal of any other components which might provide support or electrical attachments. This separation could involve, without limitation, hand picking, magnetic sorting, and/or density sorting of gross metal components.

In an alternate embodiment, the physical processing may break down the conversion device into pieces having a size of less than about 5 cm$^2$, pieces having a size of less than about 2.5 cm$^2$, pieces having a size of less than about 1 cm$^2$, or pieces having a size of less than about 0.5 cm$^2$. The physical processing step may essentially involve any type of processing which reduces the conversion device into smaller sized pieces, and such processes may include, without limitation, grinding, milling, crushing, shredding, tearing and/or chopping.

Once the separation layer has been degraded to separate the layers, there may still be a resultant mixture of non-toxic/non-hazardous components (for example, the substrate material), and toxic/hazardous components (for example, the conversion materials). This mixture of materials may be subjected to a further processing step to separate these pieces, which step may include, without limitation, physical separation, density separation and/or centrifuging of the mixture of pieces.

Figure 11:
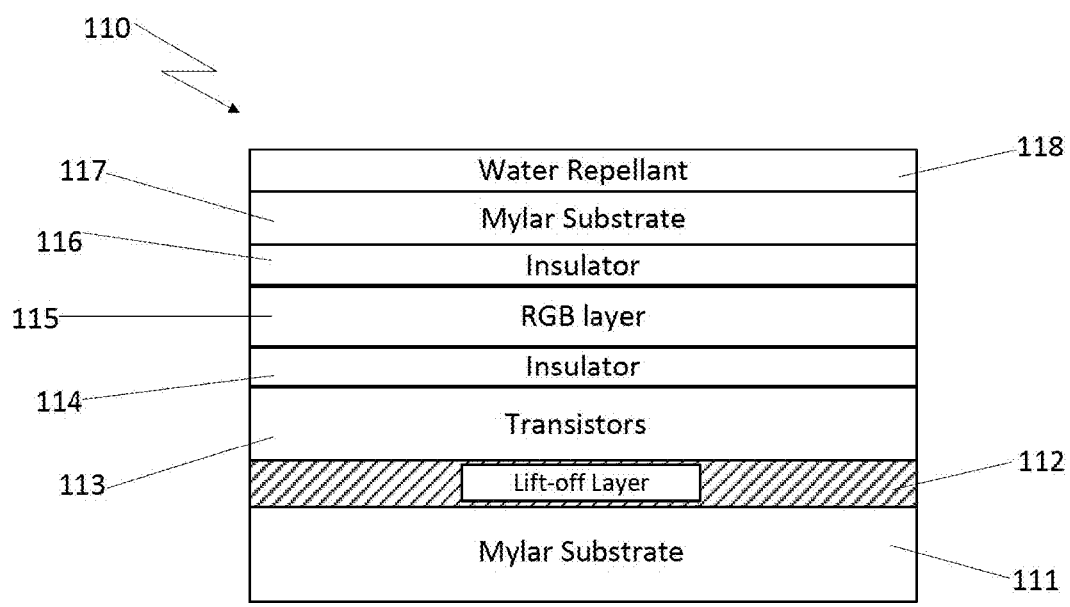
FIG. 11 depicts an illustrative separation layer in a flexible screen display device according to an embodiment.

While the above descriptions and embodiments were directed to devices for conversion of radiation into electricity, such a separation, or lift-off layer, and processing steps could be applied to other types of devices as well, for example, flexible displays or electronic devices as shown in FIG. 11. Such displays may be formed on either amorphous or more rigid support substrates 111, and a thin-flexible separation layer 112 could be placed between the substrate and the active electronic components. At the time of disposal, any hazardous components could then be separated from the substrate and isolated for further processing/recycling.

Example 1

A Radiation Harvester Having a Separation Layer

A radiation harvesting device as shown in FIG. 4 will be constructed on a rigid fiberglass substrate 10. Lead will be chosen as the separation layer 48 because of its additional radiation shielding capabilities. Lead is dissolvable with nitric acid for degradation purposes and disposal of the device. A lead film will be deposited on the substrate by radio frequency sputtering of a lead target in pure argon and argon-oxygen discharges. A cold-pressed lithium hydride layer 44 will be produced with carbon/gold tiles 42 and silica/alumina separating insulators 46 embedded therein. This layer will be adhered to the substrate 10.

Example 2

A CIGS Device with a Separation Layer and the Manufacturing Process Therefor With reference to FIGS. 7B and 8, glass will be used as the substrate 10 for a CIGS photovoltaic device. A thin cobalt layer 72 will be applied to the glass 10 by vapor deposition in which a film of cobalt will be deposited by pyrolysis of $Co_2(CO)_8$ at 200° C. in a vacuum.

The molybdenum layer 61 will be deposited onto the cobalt layer 72 by sputtering. For this, the glass 10 with the cobalt 72 thereon will be placed in a chamber and highly energetic argon gas will be used to bombard a molybdenum target source to knock off molybdenum atoms or atomic sized chunks of the molybdenum. The freed molybdenum will land on and stick to the cobalt layer to form a thin layer thereon.

The CIGS layer 62 will be deposited onto the molybdenum 61 by vapor deposition, wherein the copper, indium, gallium and selenium will be vaporized in a vacuum chamber. Under vacuum, these materials will be heated to a temperature sufficient for vaporization, which temperatures range from about 300° C. for the selenium to about 1500° C. for the copper. The four vapors will mix together in the vacuum chamber, and will deposit onto the molybdenum coated glass.

The buffer layer 63 of cadmium sulfide will be applied to the CIGS layer 62 by dipping the device into a cadmium sulfide solution and allowing the solution to dry.

The negative contact layer 64 of zinc oxide with 2% aluminum will then be applied onto the cadmium sulfate 63 by sputtering, and a top contact grid 65 of aluminum will be deposited by evaporating aluminum through a grid template to form the contact.

Example 3

Flexible Display Screen Having a Separation Layer

FIG. 11 depicts an alternate embodiment of the invention in a flexible, multi-layered self-emitting display screen 110. The screen 110 will be made with a flexible Mylar substrate layer 111, and will include a layer of polyhydroxybutyrate as the separation layer 112. For degradation purposes and disposal of the screen, polyhydroxybutyrate is soluble in chlorinated hydrocarbons, such as chloroform.

The remaining electronic components will be deposited on the polyhydroxybutyrate. A layer 113 of field effect transistors will be produced using film transistor technology, and will be covered by an insulating layer 114 of barium titanate ($BaTiO_3$). An active display layer 115 of RGB phosphorescent dots will be provided on the insulating layer 114, and will be covered with a second insulating layer 116 of barium titanate. For additional protection and durability, a second layer of Mylar 117 having a light transmission rate of 50% will be added and this will be coated with a water repellant film 118.

Example 4

Processing of a CIGS Device Having a Separation Layer

A CIGS device will be constructed in which a thin film of cobalt will be applied as the separation layer by sputtering techniques onto a glass substrate. A molybdenum layer, a CIGS layer, a cadmium sulfide layer, and a zinc oxide/aluminum layer will be deposited on the cobalt. Finally the top contact conductor will be applied. The device will be packaged and used in accordance with its intended purpose. At the end of the service life of the device, the device will be recovered for disposal purposes.

As shown in FIG. 9, the CIGS device will be subjected to physical processing 90 involving a plurality of processing steps. First, a gross separation will involve taking away packaging, sorting of modules, and/or removal of any other components which might provide support or electrical attachments. This gross separation will be performed by hand. The layered CIGS component will then be physically shredded to produce pieces having a size of less than about 1 $cm^2$ to facilitate a degradation step.

The cobalt separation layer will be dissolved by placing the pieces of the device into hydrochloric acid (process step 91), to thereby separate the glass substrate from the remaining layers. The solid pieces of substrate and layer will then be separated from the liquid acid by filtering and decanting processes. The solids will be washed to remove any remaining acid, the glass substrate will be physically separated from the CIGS components, and the glass substrate and CIGS components will be independently disposed of.

Example 5

Molybdenum Recycling from a CIGS Device Having a Separation Layer

Since molybdenum is a particularly valuable component, and could be reusable if separated from a CIGS stack, it would be desirable to further process CIGS pieces to separate the molybdenum therefrom. As such, an additional molybdenum extraction step (100 in FIG. 10) will be included in the processing of the CIGS devices and is described below.

In general, the steps for isolating the molybdenum from CIGS devices will involve the steps as set forth in Example 4 and FIG. 9, up to the separation of the glass from the CIGS pieces. Once the molybdenum-containing pieces are separated and isolated from the glass, the molybdenum will be extracted from the pieces by heating the pieces to about 790° C. in air, to oxidize the molybdenum to a molybdenum trioxide gas. A subsequent collection and cooling of the gas will be done to cause sublimation of the molybdenum trioxide into its solid form.

For re-use of the molybdenum, additional conversion processes could be conducted with the molybdenum trioxide, which processes could include, but are not limited to: reducing the molybdenum trioxide with a reduction agent to form solid molybdenum, reducing the molybdenum trioxide with hydrogen to form solid molybdenum, dissolving the molybdenum trioxide with ammonia to form molybdates, and reducing of the molybdenum trioxide with iron to form ferromolybdenum.

In the above detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be used, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

Various of the above-disclosed and other features and functions, or alternatives thereof, may be combined into many other different systems or applications. Various presently unforeseen or unanticipated alternatives, modifications, variations or improvements therein may be subsequently made by those skilled in the art, each of which is also intended to be encompassed by the disclosed embodiments.

What is claimed is:

1. A method for disposing of at least a portion of a device for converting radiation into electrical energy, the device having a substrate, a conversion layer configured to convert radiation into electrical energy, and a layer of at least one metal disposed between and bonded to the substrate and the conversion layer, wherein the at least one metal substantially maintains the electrical, chemical and physical properties of the conversion layer when bonded to the conversion layer, the method comprising:
   exposing the device to one of at least one acid or at least one base to dissolve the at least one metal for separating the conversion layer from the substrate; and separately disposing of at least a portion of each of the substrate and the conversion layer,
wherein exposing the device and separately disposing of at least a portion of each of the substrate and the conversion layer occur at the end of a service life of the device.

2. The method of claim 1, further comprising:
extracting at least a portion of at least one additional component from at least one of the substrate and the conversion layer; and
separately disposing of at least a portion of the extracted component and at least a portion of the at least one of the substrate and the conversion layer.

3. The method of claim 1, wherein exposing the device comprises exposing the device to one of the at least one acid or the at least one base to dissolve the at least one metal, wherein the at least one metal comprises one or more of the following: cobalt, lead, platinum, gold, silver, copper, chromium, titanium, zinc, magnesium, scandium, vanadium, manganese, iron, nickel, yttrium, zirconium, niobium, molybdenum, technetium, ruthenium, rhodium, palladium, cadmium, hafnium, tantalum, tungsten, rhenium, osmium, iridium, mercury, rutherfordium, dubnium, seaborgium, bohrium, hassium, meitnerium, ununnilium, unununium, and ununbium.

4. The method of claim 1, wherein exposing the device comprises:
processing the device to break down the device into pieces having a size of less than about 1 cm² prior to separating of the conversion layer from the substrate;
mixing the pieces with a solution of the one of at least one acid or at least one base to dissolve the metal to release the conversion layer from the substrate, resulting in a mixture of pieces of the conversion layer and pieces of the substrate in solution;
separating the mixture of pieces of the conversion layer and pieces of the substrate from the solution;
separating the pieces of the conversion layer from the pieces of the substrate; and
wherein the separately disposing comprises separately disposing of the pieces of the conversion layer and the pieces of the substrate.

5. The method of claim 4, wherein:
the processing comprises processing the device to break down the device into pieces having a size of less than about 1 cm² by means of at least one of grinding, milling, crushing, shredding, tearing and chopping;
the separating the mixture of pieces of the conversion layer and pieces of the substrate from the solution comprises one or more of: decanting the solution from the pieces; filtering the pieces from the solution, density separation and physical separation;
the separating the pieces of the conversion layer from the pieces of the substrate comprises one or more of: physical separation, density separation and centrifuging the mixture of pieces of the conversion layer and pieces of the substrate; and
the separately disposing comprises recycling at least a portion of the pieces of the conversion layer and at least a portion of the pieces of the substrate.

6. The method of claim 1, wherein the disposing comprises disposing of the at least a portion of the device for converting radiation into electrical energy, wherein the radiation comprises radiation having a wavelength between about $10^{-2}$ m to about $10^{-12}$ m, and the device comprises one of: a rectenna, a nantenna, a photovoltaic cell, and a radiation harvester.

7. The method of claim 1, wherein the disposing comprises disposing of the at least a portion of the device for converting radiation into electrical energy, wherein the device comprises one of:
a CIGS photovoltaic device and the conversion layer comprises a CIGS layer; and
a CIS photovoltaic device and the conversion layer comprises a CIS layer.

8. The method of claim 5, wherein recycling the at least a portion of the pieces of the conversion layer comprises extracting molybdenum from the at least a portion of the pieces of the conversion layer.

9. The method of claim 8, wherein extracting the molybdenum comprises:
heating the pieces of the conversion layer to a temperature sufficient to oxidize the molybdenum to form molybdenum trioxide gas; and
isolating and converting molybdenum trioxide gas to solid molybdenum.

10. The method of claim 9, wherein converting molybdenum trioxide gas to solid molybdenum comprises:
reducing the molybdenum trioxide with a reduction agent to form solid molybdenum;
reducing the molybdenum trioxide with hydrogen to form solid molybdenum;
dissolving the molybdenum trioxide with ammonia to form molybdates; and
reducing of the molybdenum trioxide with iron to form ferromolybdenum.

* * * * *